(12) United States Patent
Vidhani et al.

(10) Patent No.: US 6,694,499 B2
(45) Date of Patent: Feb. 17, 2004

(54) VERIFYING DECOUPLING CAPACITANCE USING A MAXIMUM FLOW DETERMINATION OF A NETWORK

(75) Inventors: Devendra Vidhani, Sunnyvale, CA (US); Tyler Thorp, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 106 days.

(21) Appl. No.: 10/005,006

(22) Filed: Dec. 4, 2001

(65) Prior Publication Data

US 2003/0106032 A1 Jun. 5, 2003

(51) Int. Cl.$^7$ ............................................... G06F 17/50
(52) U.S. Cl. .................................... 716/5; 716/4; 716/1
(58) Field of Search .................... 716/1–18; 438/14–18

(56) References Cited

U.S. PATENT DOCUMENTS

| | | | |
|---|---|---|---|
| 6,211,701 B1 | * 4/2001 | Kuijk et al. | 326/83 |
| 6,323,050 B1 | * 11/2001 | Dansky et al. | 438/17 |
| 6,446,016 B1 | * 9/2002 | Zhu | 702/69 |
| 2002/0170748 A1 | * 11/2002 | Larson | 174/260 |
| 2003/0034783 A1 | * 2/2003 | Thorp et al. | 324/519 |

OTHER PUBLICATIONS

Mark F. Bramlette, "Finding Maximum Flow With Random and Genetic Search," IEEE, Jun. 1994, pp. 296–299.*

Park et al., "Neural–Net Approach to the Maximum Flow Problem," IEEE, Apr. 1998, pp. 786–787.*

* cited by examiner

*Primary Examiner*—Vuthe Siek
(74) *Attorney, Agent, or Firm*—Rosenthal & Osha L.L.P.

(57) ABSTRACT

A technique for verifying decoupling capacitance using a maximum flow determination is provided. The technique involves generating a network representing decoupling capacitors and driver elements on an integrated circuit, selectively establishing connections between decoupling capacitors and driver elements, and determining a maximum flow of the network. Using the maximum flow of the network, a designer may then verify whether particular driver elements are receiving sufficient decoupling capacitance and whether particular decoupling capacitors are being used efficiently, and subsequently redesign an integrated circuit as deemed necessary.

28 Claims, 12 Drawing Sheets

VERIFYING DECOUPLING CAPACITANCE USING A MAXIMUM FLOW DETERMINATION OF A NETWORK

BACKGROUND OF INVENTION

A typical computer system has at least a microprocessor and memory. The microprocessor processes, i.e., executes, instructions to accomplish various tasks of the computer system. Such instructions, along with the data required by the microprocessor when executing these instructions, are stored in some form of memory. FIG. 1 shows a typical computer system having a microprocessor (10) and some form of memory (12). The microprocessor (10) has, among other components, a central processing unit (also known and referred to as "CPU" or "execution unit") (14) and a memory controller (also known as "load/store unit") (16). The CPU (14) is where the actual arithmetic and logical operations of the computer system take place. To facilitate the execution of operations by the CPU (14), the memory controller (16) provides the CPU (14) with necessary instructions and data from the memory (12). The memory controller (16) also stores information generated by the CPU (14) into the memory (12).

The operations that occur in a computer system, such as the logical operations in the CPU and the transfer of data between the CPU and memory, require power. If the components responsible for carrying out specific operations do not receive adequate power in a timely manner, computer system performance is susceptible to functional and timing degradation. As an added challenge, power consumption of modern computers has increased as a consequence of increased operating frequencies. Thus, providing power to the components in a computer system in a sufficient and timely manner has become an issue of significant importance.

Often, power supply to a particular computer system element varies, which, in turn, effects the integrity of the element's output. Typically, this power variation results from the distance between a power supply for the element and the element itself. This distance may lead to the element not receiving power (via current) at the exact time it is required.

As shown in FIG. 2, one approach used by designers to combat this performance-inhibiting behavior is introducing decoupling capacitance to a particular circuit by positioning one or more decoupling capacitors (22) close to drivers (i.e., circuit elements, such as transistors, responsible for inputting and selectively outputting signals) (24) on an integrated circuit (20). These decoupling capacitors (22) store charge from a power supply and distribute the charge to the drivers (24) when needed. For example, if power received by a driver (24) from a power supply line (26) attenuates, one or more decoupling capacitors (22) will distribute charge to the driver (24) to ensure that the driver (24) is not affected by the power variation on the power supply line (26). In essence, a decoupling capacitor acts as a local power supply for one or more elements in a computer system.

It follows that an important concern for designers is not only to ensure that there is sufficient overall decoupling capacitance on an integrated circuit, but also to ensure that the capacitance needs of the individual elements on the integrated circuit are met. In other words, although the total decoupling capacitance requirement of an integrated circuit may be met through the displacement of decoupling capacitors on the integrated circuit, certain elements may not receive sufficient decoupling capacitance due to (1) excessive decoupling capacitance provided to other elements and/or (2) the positions of decoupling capacitors being 'too far' from decoupling capacitance requiring elements to effectively provide any decoupling capacitance to those elements. Thus, in order to ensure that individual elements on an integrated circuit receive sufficient decoupling capacitance, there is a need for a decoupling capacitance verification technique by which one can determine whether decoupling capacitors are being used effectively and whether particular circuit elements are receiving sufficient decoupling capacitance.

SUMMARY OF INVENTION

According to one aspect of the present invention, a method for verifying decoupling capacitance on an integrated circuit having a decoupling capacitor and a driver element comprises defining a first node (where the first node represents the decoupling capacitor), defining a second node (where the second node represents the driver element), generating a network comprising the first node and the second node, selectively establishing a connection between the first node and the second node, determining a maximum flow value for the connection between the first node and the second node, and determining whether the maximum flow value is substantially equal to a decoupling capacitance need value of the driver element.

According to another aspect, a method for verifying decoupling capacitance on an integrated circuit having a plurality of decoupling capacitors and a plurality of driver elements comprises defining a first set of nodes (where the first set of nodes represents the plurality of decoupling capacitors), defining a second set of nodes (where the second set of nodes represents the plurality of driver element), selectively establishing a first plurality of connections between a node in the second set of nodes and nodes in the first set of nodes that represent decoupling capacitors that provide decoupling capacitance to a driver element represented by the node, determining maximum flow values for the first plurality of connections; and determining whether a total of the maximum flow values is substantially equal to the decoupling capacitance need value of the driver element.

According to another aspect, a computer system comprises a processor, a memory, and instructions, residing in the memory and executable on the processor, for verifying decoupling capacitance on a microprocessor circuit using a maximum flow determination of a network representing a plurality of driver elements and a plurality of decoupling capacitors on the microprocessor.

According to another aspect, a method for designing an integrated circuit comprises verifying decoupling capacitance of an original design of an integrated circuit using a flow determination of a network representative of decoupling capacitors and driver elements on the integrated circuit and redesigning the integrated circuit dependent on the verification.

According to another aspect, a computer-readable medium having recorded therein instructions executable by processing, where the instructions for defining a first node (where the first node represents a decoupling capacitor on an integrated circuit), defining a second node (where the second node represents a driver element on the integrated circuit), generating a network comprising the first node and the second node, selectively establishing a connection between the first node and the second node, determining a maximum flow value for the connection between the first node and the second node, and determining whether the maximum flow value is substantially equal to a decoupling capacitance need value of the driver element.

According to another aspect, a computer-readable medium having recorded therein instructions executable by processing, where the instructions are for defining a first set of nodes (where the first set of nodes represents a plurality of decoupling capacitors on an integrated circuit), defining a second set of nodes (where the second set of nodes represents a plurality of driver elements on the integrated circuit), selectively establishing a first plurality of connections between a node in the second set of nodes and nodes in the first set of nodes that represent decoupling capacitors that provide decoupling capacitance to a driver element represented by the node, determining maximum flow values for the first plurality of connections, and determining whether a total of the maximum flow values is substantially equal to a decoupling capacitance need value of the driver element.

According to another aspect, a method for graphically verifying decoupling capacitance on an integrated circuit comprises generating a directed graph comprising a plurality of decoupling capacitor nodes and a plurality of driver element nodes, defining a source node (where the source node has edges connected to the plurality of decoupling capacitor nodes), defining a sink node (where the sink node has edges connected to the plurality of driver element nodes), selectively establishing a plurality of edges between the plurality of decoupling capacitor nodes and the plurality of driver element nodes, determining a maximum flow from the source node to the sink node, and using the maximum flow to verify decoupling capacitance on the integrated circuit.

Other aspects and advantages of the invention will be apparent from the following description and the appended claims.

BRIEF DESCRIPTION OF DRAWINGS

FIGS. 3b–d show stages of a decoupling capacitance verification technique in accordance with the embodiment shown in FIG. 3a.

FIGS. 5b–e show stages of a decoupling capacitance verification technique in accordance with the embodiment shown in FIG. 5a.

DETAILED DESCRIPTION

Embodiments of the present invention relate to a method and apparatus for verifying decoupling capacitance on an integrated circuit using a maximum flow determination of a network representing decoupling capacitors and driver elements on the integrated circuit. Embodiments of the present invention further relate to a computer system that verifies decoupling capacitance on an integrated circuit using a maximum flow determination of a network representative of the integrated circuit. Embodiments of the present invention further relate to a computer-readable medium that has instructions for generating a network representing decoupling capacitors and driver elements on an integrated circuit, selectively establishing connections between the decoupling capacitors and driver elements, and determining a maximum flow of the network, where the maximum flow of the network is subsequently used to verify decoupling capacitance on the integrated circuit. Embodiments of the present invention further relate to a method and apparatus for determining whether an integrated circuit needs to be redesigned due to inefficient decoupling capacitor use. Embodiments of the present invention further relate to a method and apparatus for determining whether an integrated circuit needs to be redesigned due to one or more driver elements on the integrated circuit not receiving sufficient decoupling capacitance. Embodiments of the present invention further relate to an integrated circuit manufacturing process in which decoupling capacitance is verified using a maximum flow determination. Embodiments of the present invention further relate to a graphical process using a maximum flow determination by which decoupling capacitance may be verified.

Figure 1:
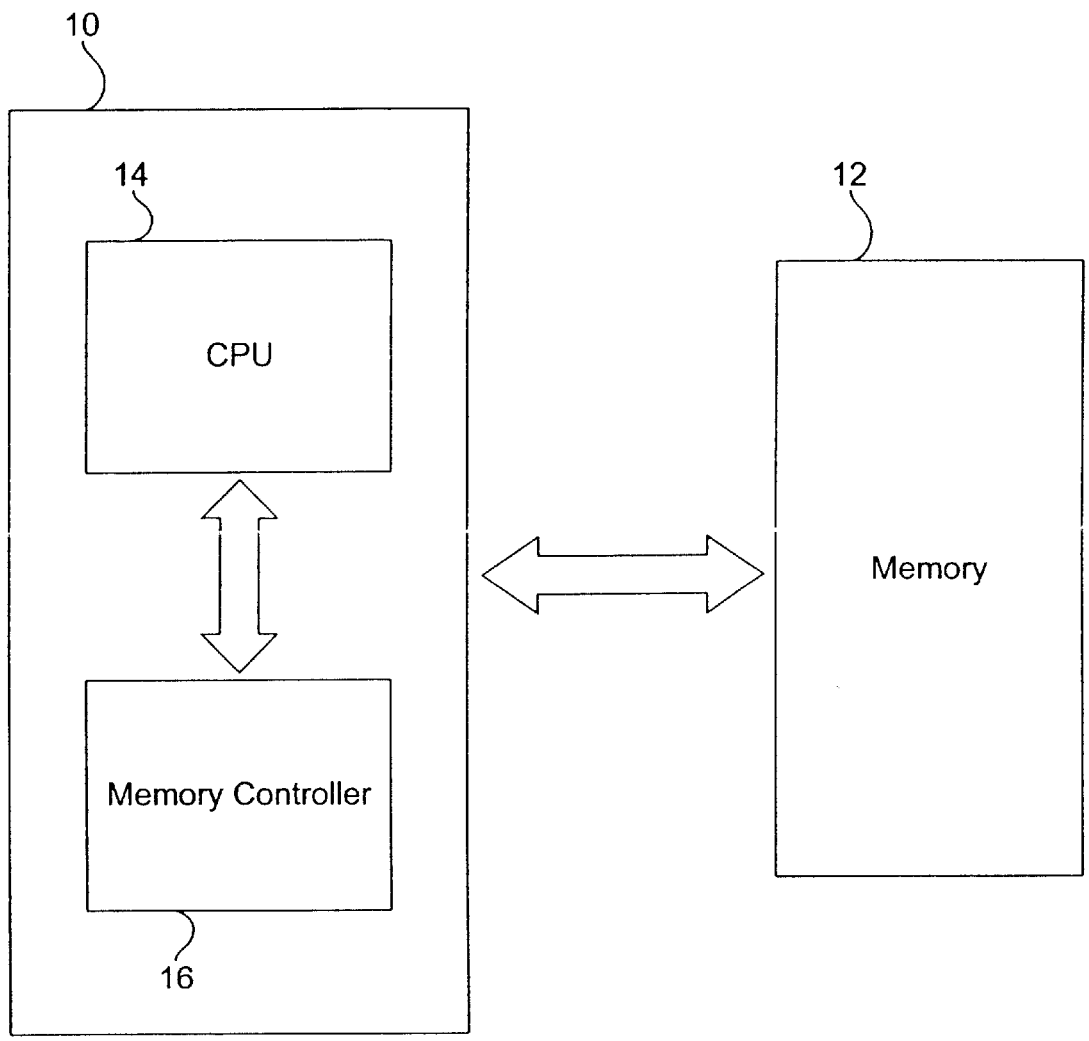
FIG. 1 shows a typical computer system.
Figure 2:
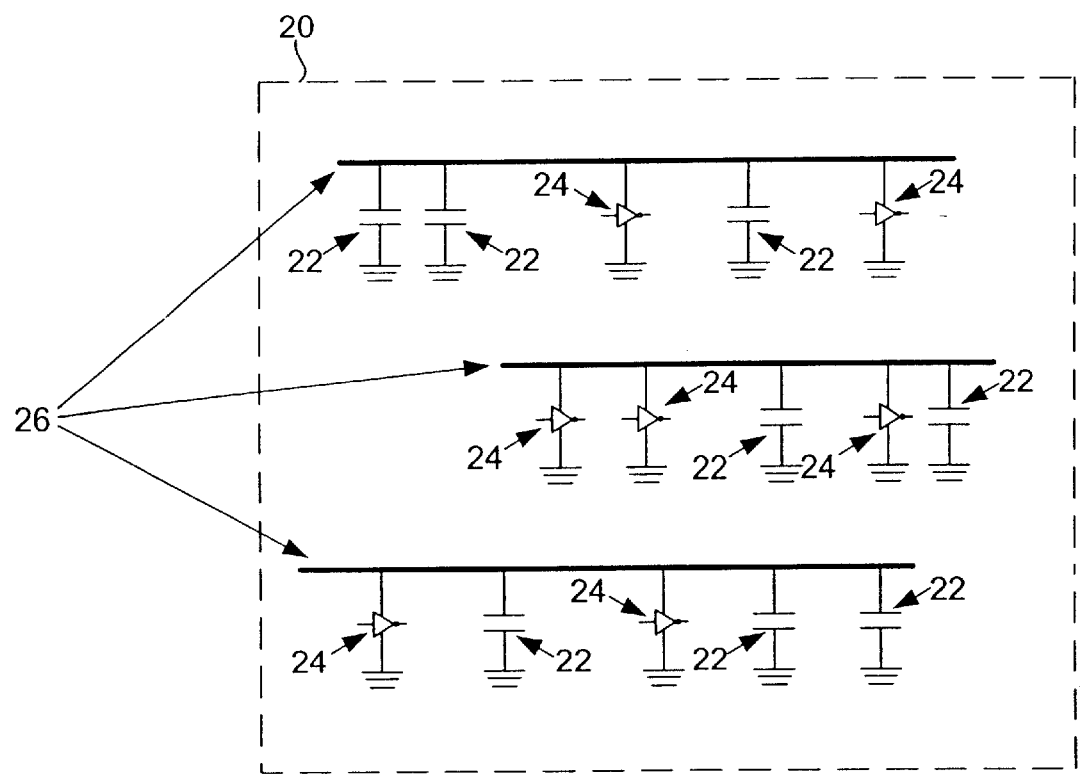
FIG. 2 shows a typical integrated circuit having decoupling capacitors and driver elements.
Figure 3A:
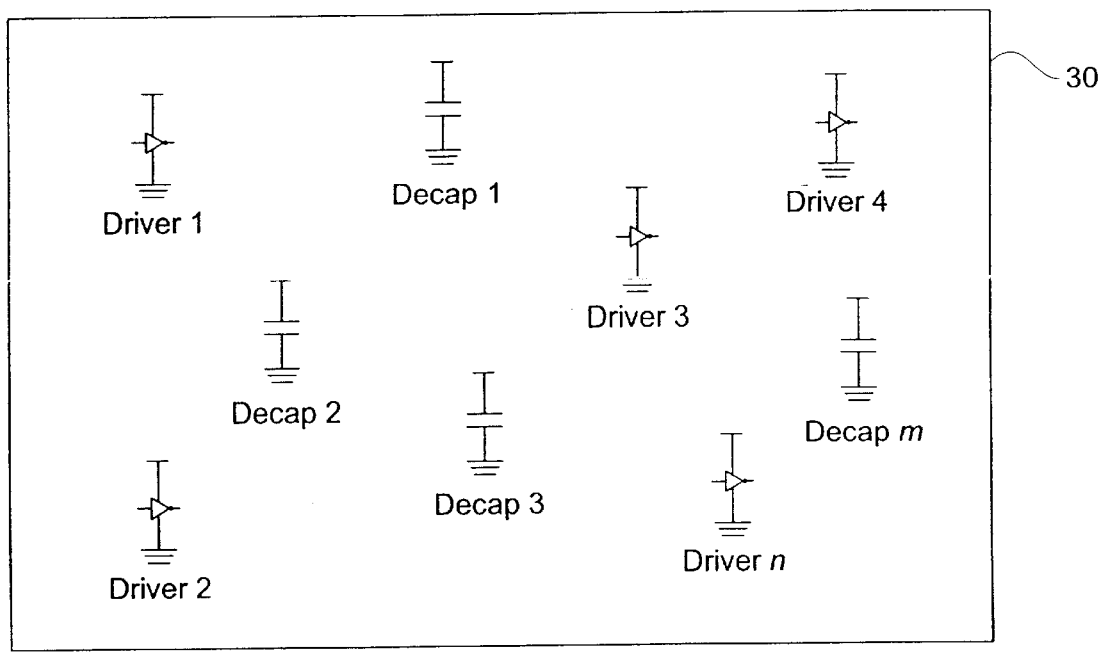
FIG. 3a shows an integrated circuit that is used to describe an embodiment of the present invention.

FIG. 3a shows an exemplary integrated circuit (30) that is used to describe an embodiment of the present invention. The integrated circuit (30) has a plurality of decoupling capacitors, labeled in FIG. 3a as Decaps 1 . . . m, and a plurality of driver elements, labeled in FIG. 3a as Drivers 1 . . . n.

Those skilled in the art will appreciate that driver elements, for purposes of the present invention, may be any power consuming device or element on an integrated circuit.

Figure 3B:
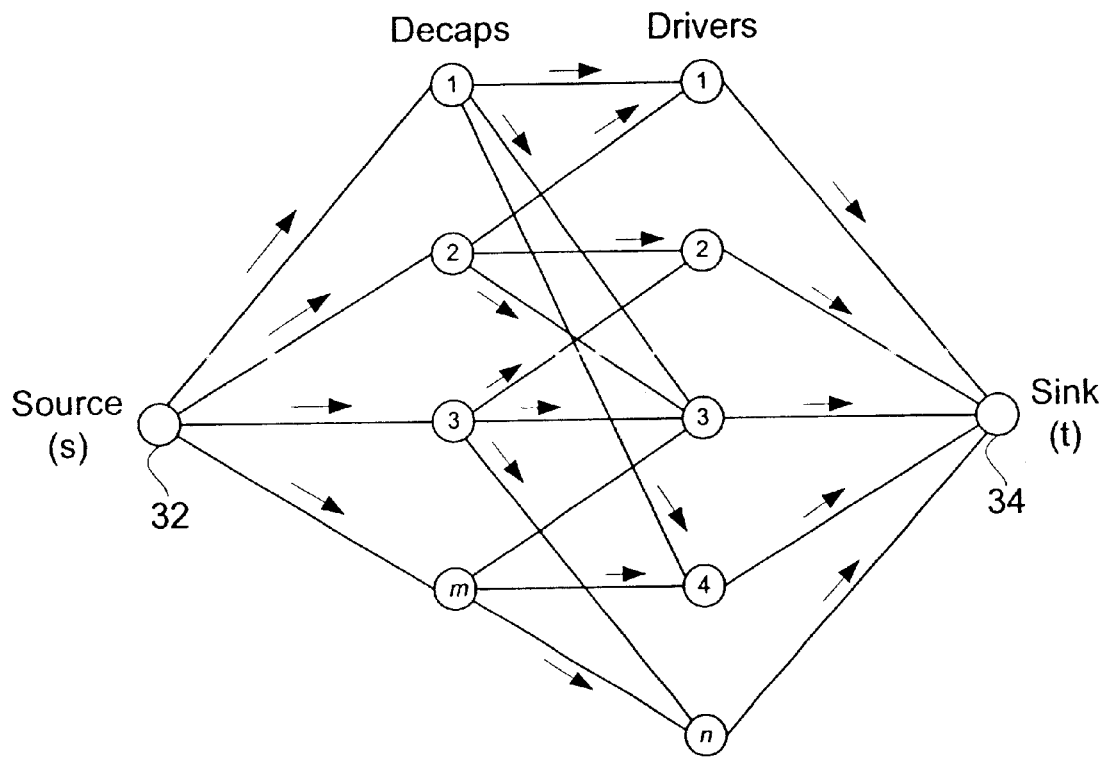

FIG. 3b shows an exemplary stage of a decoupling verification technique in accordance with the embodiment shown in FIG. 3a. In FIG. 3b, a network is formed, where a first set of nodes, labeled in FIG. 3b as Decaps 1 . . . m, represents the decoupling capacitors on the integrated circuit (30), and where a second set of nodes, labeled in FIG. 3b as Drivers 1 . . . n, represents the driver elements on the integrated circuit (30). Further, each decoupling capacitor node is connected to a source node (32), and each driver is connected to a sink node (34).

Still referring to FIG. 3b, a driver element node is connected to those decoupling capacitor nodes that represent decoupling capacitors on the integrated circuit (30) that provide decoupling capacitance to the driver element represented by the driver element node. It follows that a decoupling capacitor node is connected to those driver element nodes that represent driver elements on the integrated circuit (30) to which the decoupling capacitor represented by the decoupling capacitor node provides decoupling capacitance. Such selective relationships between nodes are formed because decoupling capacitors that reside 'too far' away from a driver element are not able to provide effective decoupling capacitance, i.e., charge, to the driver element.

Connections between nodes, for purposes of describing the present invention, will also be referred to as "edges." Each edge connecting the source node to a particular decoupling capacitor node has a weight corresponding to a decoupling capacitance value of the decoupling capacitor represented by that particular decoupling capacitor node. Each decoupling capacitance node may be thought of as having a particular decoupling capacitance 'offer.' For example, an edge between the source node and Decap 3 has a value corresponding to the nominal decoupling capacitance provided by the third decoupling capacitor, labeled in FIG. 3a as Decap 3. The weight of an edge also serves as an upper bound on the flow from the source node to a decoupling capacitor node.

Similarly, each edge connecting the sink node to a particular driver element node has a weight corresponding to a decoupling capacitance need of the driver element represented by that particular driver element node. Each driver element node may be thought of as having a particular decoupling capacitance 'demand.' For example, an edge between the sink node and Driver 1 has a value corresponding to the decoupling capacitance need of the first driver element, labeled in FIG. 3a as Driver 1. The weight of an edge also serves as an upper bound on the flow from a driver element node to the sink node.

Edges between driver element nodes and decoupling capacitor nodes are initially presumed, i.e., at the time of generating the network, to have an unknown or infinite weight. Once the network as shown in FIG. 3b is formed, the maximum flow from the source node to the sink node subject to conservation of flow constraints at each node and flow bounds on each edge is determined. For purposes of illustration, arrows are shown on the edges to show the direction of flow from the source node to the sink node.

Note that the network shown in FIG. 3b has properties similar to that of a bipartite graph, a type of directed graph. Those skilled in the art will appreciate that because the network in FIG. 3b may be treated as a directed graph, a designer has added flexibility in using the network for decoupling capacitance verification.

Various maximum flow determination techniques are known in the art, such as the commonly used Ford-Fulkerson Max-Flow Labeling Algorithm. Those skilled in the art will appreciate that the present invention is not limited to or dependent on any particular maximum flow determination technique. Instead, the present invention is directed toward a technique that uses a maximum flow determination to verify decoupling capacitance on an integrated circuit. The present invention facilitates, among other things, design and implementation of the integrated circuit.

Figure 3C:
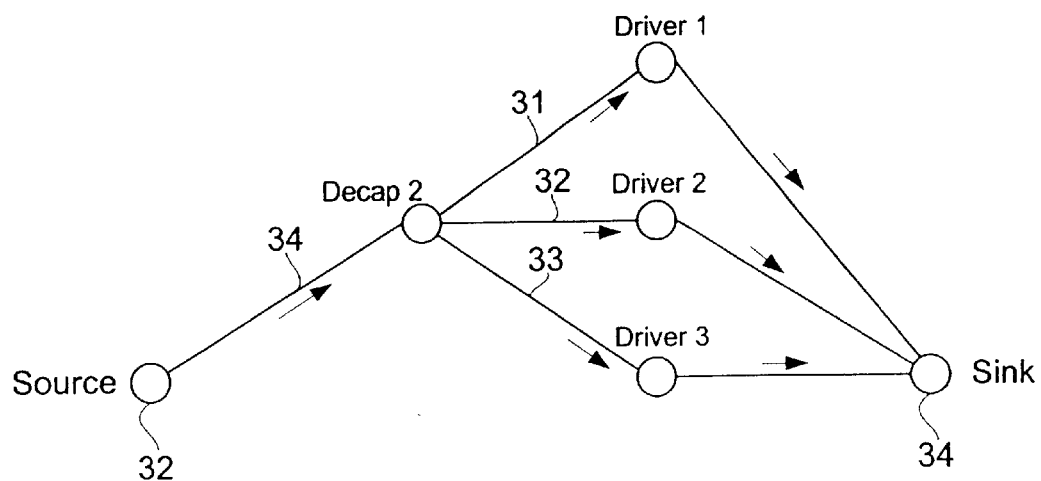

Once a maximum flow of the network shown in FIG. 3b is determined, a particular decoupling capacitor node is examined as shown in FIG. 3c. Particularly, in FIG. 3c, Decap 2 is examined. After the maximum flow of the network shown in FIG. 3b is determined, edges (31, 32, 33) between Decap 2 and those driver element nodes connected to Decap 2, i.e., Drivers 1, 2, and 3, have specific values. One may then examine the decoupling capacitance value on the edge (34) between Decap 2 and the source node against the distribution of values on the edges (31, 32, 33) between Decap 2 and the connected driver elements, i.e., Drivers 1, 2, and 3.

If the decoupling capacitance value on the edge between a decoupling capacitor node and the source node is greater than the total of the maximum flow values of the edges between the decoupling capacitor node and the connected driver element nodes, this indicates that the decoupling capacitor represented by the decoupling capacitor node is not being used to its maximum capability. In this case, a designer may (1) use another decoupling capacitor that provides less decoupling capacitance, (2) add one or more driver elements to which the decoupling capacitor can provide decoupling capacitance, (3) decrease the size, i.e., the strength, of the decoupling capacitor, and/or (4) redesign the portion of the integrated circuit on which the decoupling capacitor resides in order to generate a more efficient integrated circuit design. Those skilled in the art will appreciate that by using another decoupling capacitor that provides less capacitance or decreasing the size of the decoupling capacitor, area on the integrated circuit may be saved, thus allowing space for additional circuitry, i.e., increased functionality. Further, those skilled in the art will appreciate that the saved space may also be used (1) to save power, (2) to increase driver element size, (3) to prevent over-designing, etc.

If the decoupling capacitance value on the edge between a decoupling capacitor node and the source node is equal to the total of the maximum flow values of the edges between the decoupling capacitor node and the connected driver element nodes, this indicates that the decoupling capacitor represented by the decoupling capacitor node is being used to its fullest potential. This may be viewed as an 'ideal' case.

Those skilled in the art will appreciate that by repeating the examination process described above for other decoupling capacitor nodes in a network, one may verify whether the decoupling capacitors represented by the decoupling capacitor nodes are efficiently used.

In other embodiments, a designer may examine a maximum flow value on an edge between a source node and a decoupling capacitor node to determine if the maximum flow value is less than or equal to the upper bound initially set for the edge. In other words, because the maximum flow value on the edge will be equal to the total of the maximum flow values on the edges between the decoupling capacitor node and connected driver element nodes, one may simply examine the maximum flow value on the edge between the source node and the decoupling capacitor node to determine whether that maximum flow value is less than or equal to the upper bound for that edge.

Figure 3D:
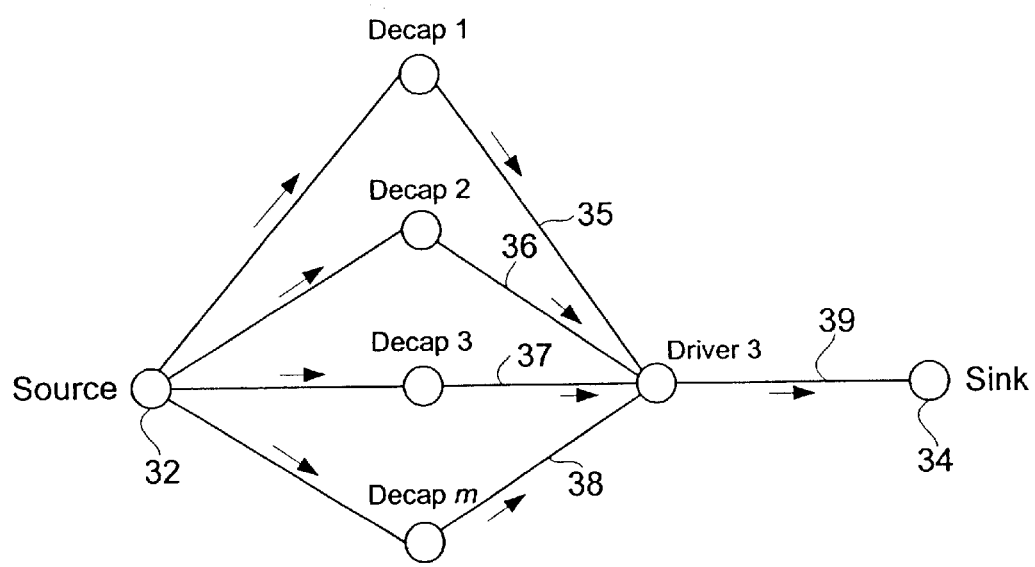

Similarly, a particular driver element node is examined as shown in FIG. 3d. Particularly, in FIG. 3d, Driver 3 is examined. After the maximum flow of the network shown in FIG. 3b is determined, edges (35, 36, 37, 38) between Driver 3 and those decoupling capacitor nodes connected to Driver 3, i.e., Decaps 1, 2, 3, and m, have specific values. One may then examine the decoupling capacitance need on the edge (39) between Driver 3 and the sink node against the distribution of values on the edges (35, 36, 37, 38) between Driver 3 and the connected decoupling capacitor nodes, i.e., Decaps 1, 2, 3, and m.

If the decoupling capacitance need on the edge between a driver element node and the sink node is greater than the total of the maximum flow values of the edges between the driver element node and the connected decoupling capacitor nodes, this indicates that the driver element represented by the driver element node is not receiving sufficient decoupling capacitance. In this case, a designer may (1) if possible, use another driver element that needs less decoupling capacitance, (2) add one or more decoupling capacitors from which the driver element can receive decoupling capacitance, (3) if possible, decrease the size, i.e., the strength, of the driver element, and/or (4) redesign the portion of the integrated circuit on which the driver element resides in order to generate a more efficient integrated circuit design. Those skilled in the art will appreciate that by using another driver element that needs less capacitance or decreasing the size of the driver element, area on the integrated circuit may be saved, thus allowing space for additional circuitry, i.e., increased functionality. Further, those skilled in the art will appreciate that the saved space may also be used (1) to save power, (2) to increase driver element size, (3) to prevent over-designing, etc.

If the decoupling capacitance need on the edge between a driver element node and the sink node is equal to the total of the maximum flow values of the edges between the driver element node and the connected decoupling capacitor nodes, this indicates that the driver element represented by the driver element node is receiving sufficient decoupling capacitance. Those skilled in the art will appreciate that in some embodiments, a designer may design an integrated circuit such that a driver element on the integrated circuit can tolerate slight decoupling capacitance variations, in which case the designer may deem a driver element to be receiving sufficient decoupling capacitance when the decoupling capacitance need on the edge between a driver element node representing the driver element and a sink node is 'substantially equal' to the total of maximum flow values on edges between the driver element node and connected decoupling capacitor nodes.

Those skilled in the art will appreciate that by repeating the examination process described above for other driver element nodes in a network, one may verify whether the driver elements represented by the driver element nodes are receiving sufficient decoupling capacitance.

In other embodiments, a designer may examine a maximum flow value on an edge between a driver element node and a sink node to determine if the maximum flow value is less than or equal to the upper bound initially set for the edge. In other words, because the maximum flow value on the edge will be equal to the total of the maximum flow values on the edges between the driver element node and connected decoupling capacitor nodes, one may simply examine the maximum flow value on the edge between the driver element node and the sink node to determine whether that maximum flow value is less than or equal to the upper bound for that edge.

Those skilled in the art will appreciate that the particular arrangement of nodes in FIGS. 3b–d is shown for purposes of more clearly understanding the present invention. Other embodiments may use different arrangements of nodes, and still yet other embodiments may arrange nodes in memory and/or using software programs. As long as the relationships between the decoupling capacitors and driver elements are treated and viewed as described in the embodiments of the present invention, the principles of the present invention are met.

Figure 4:
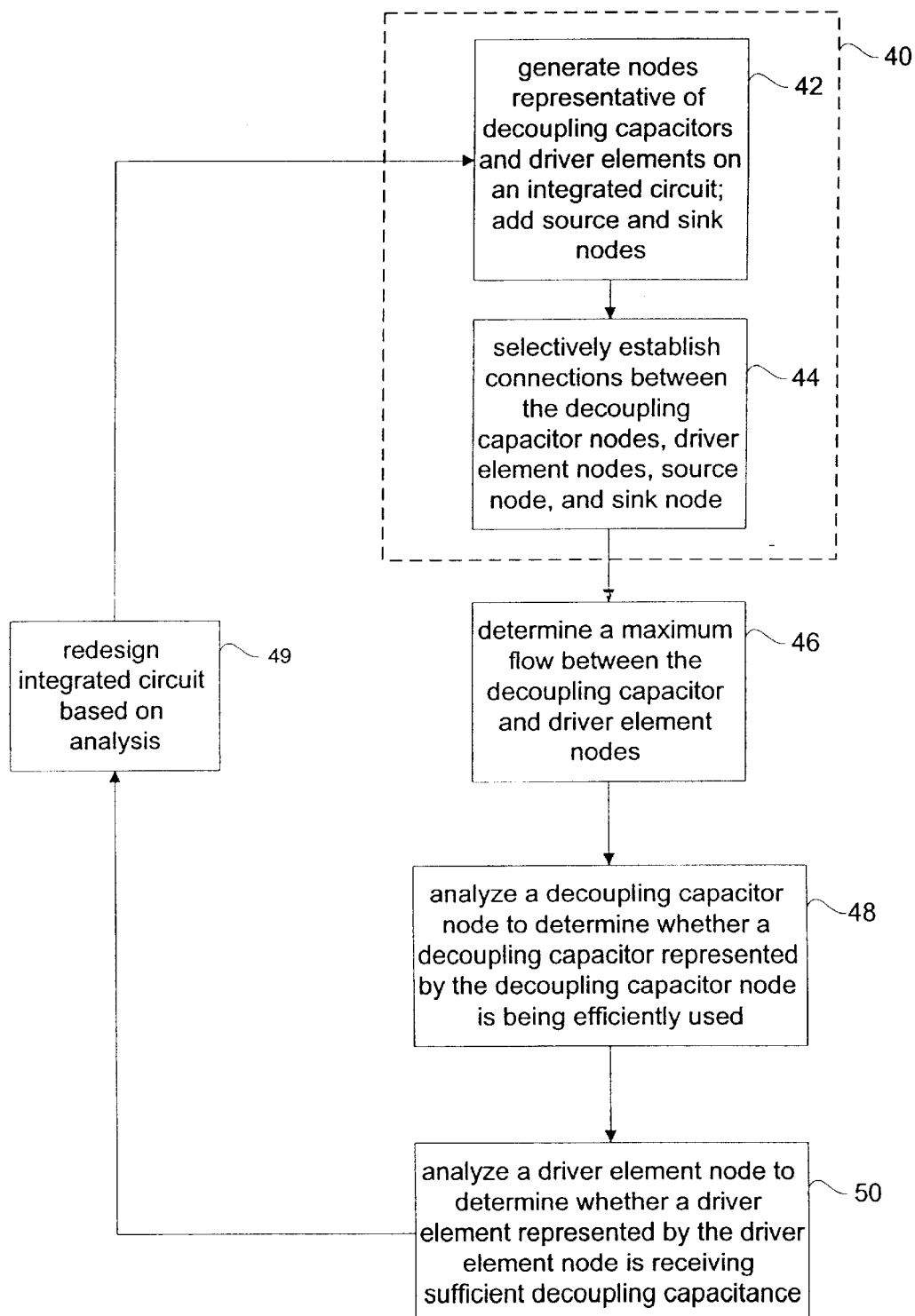
FIG. 4 shows a flow process in accordance with an embodiment of the present invention.

FIG. 4 shows an exemplary flow process in accordance with an embodiment of the present invention. The flow process begins with a network generation stage (40). The network generation stage (40) includes (1) generating, in addition to a source node and a sink node, nodes representative of decoupling capacitors and driver elements on an integrated circuit (step 42) and (2) selectively establishing connections between the decoupling capacitor nodes, driver element nodes, source node, and sink node (step 44). Once the network is generated, a maximum flow between the decoupling capacitor and driver element nodes is determined (step 46). The maximum flow determination results in the establishment of maximum flow values on the connections selectively established between the decoupling capacitor and driver element nodes.

Thereafter, an individual decoupling capacitor node may be analyzed using a total of the maximum flow values on connections between the decoupling capacitor node and connected driver element nodes in order to determine whether a decoupling capacitor represented by the decoupling capacitor node is being efficiently used (step 48). Further, an individual driver element node may be analyzed using a total of the maximum flow values on connections between the driver element node and connected decoupling capacitor nodes in order to verify that a driver element represented by the driver element node is receiving sufficient decoupling capacitance (step 50). Steps 48 and 50 may be repeated, as desired, for additional decoupling capacitor and driver element nodes.

Those skilled in the art will appreciate that in some embodiments, once a desired amount of driver element nodes and/or decoupling capacitor nodes have been examined/analyzed, a designer may redesign the integrated circuit accordingly and repeat the flow process shown in FIG. 4 to analyze the redesigned integrated circuit (step 49).

Figure 5A:
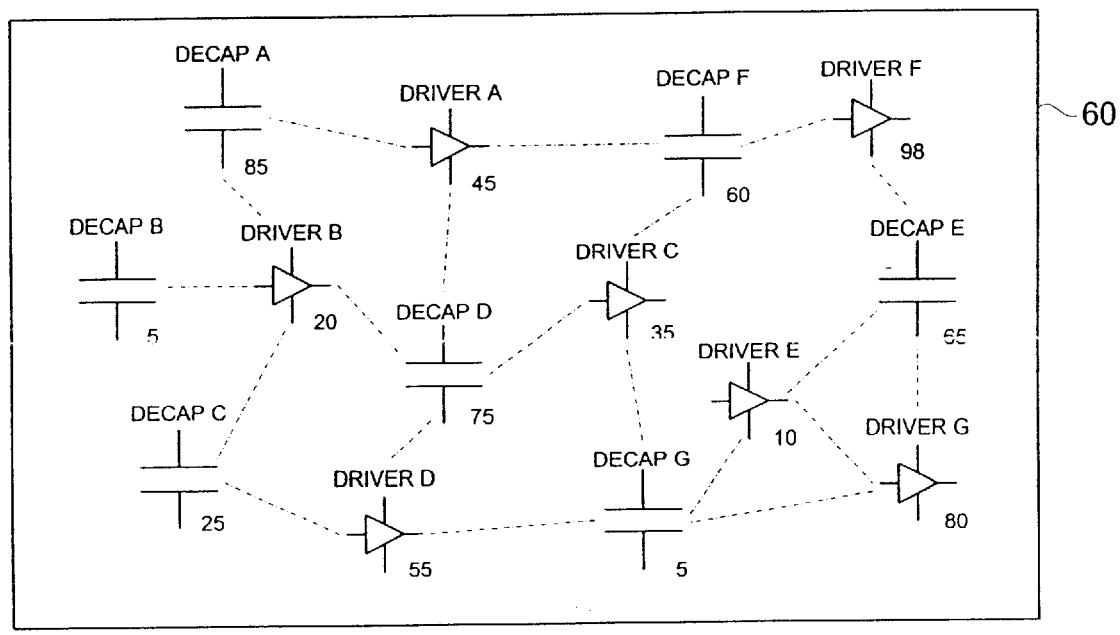
FIG. 5a shows an integrated circuit that is used to describe an embodiment of the present invention.

FIG. 5a shows an exemplary integrated circuit (60) that is used to describe another embodiment of the present invention. Particularly, the integrated circuit (60) has decoupling capacitors, labeled in FIG. 5a as Decaps A . . . G, and driver elements, labeled in FIG. 5a as Drivers A . . . G. Each decoupling capacitor can provide a particular amount of decoupling capacitance (also referred to as decoupling capacitance "offer") that is quantified by a number next to each decoupling capacitor on the integrated circuit (60). Similarly, each driver element requires a particular amount of decoupling capacitance (also referred to as decoupling capacitance "demand") that is quantified by a number next to each driver element on the integrated circuit (60). Further, dotted lines are shown in FIG. 5a to illustrate pairs of decoupling capacitors and driver elements in which the decoupling capacitor effectively provides decoupling capacitance to the driver element.

Figure 5B:
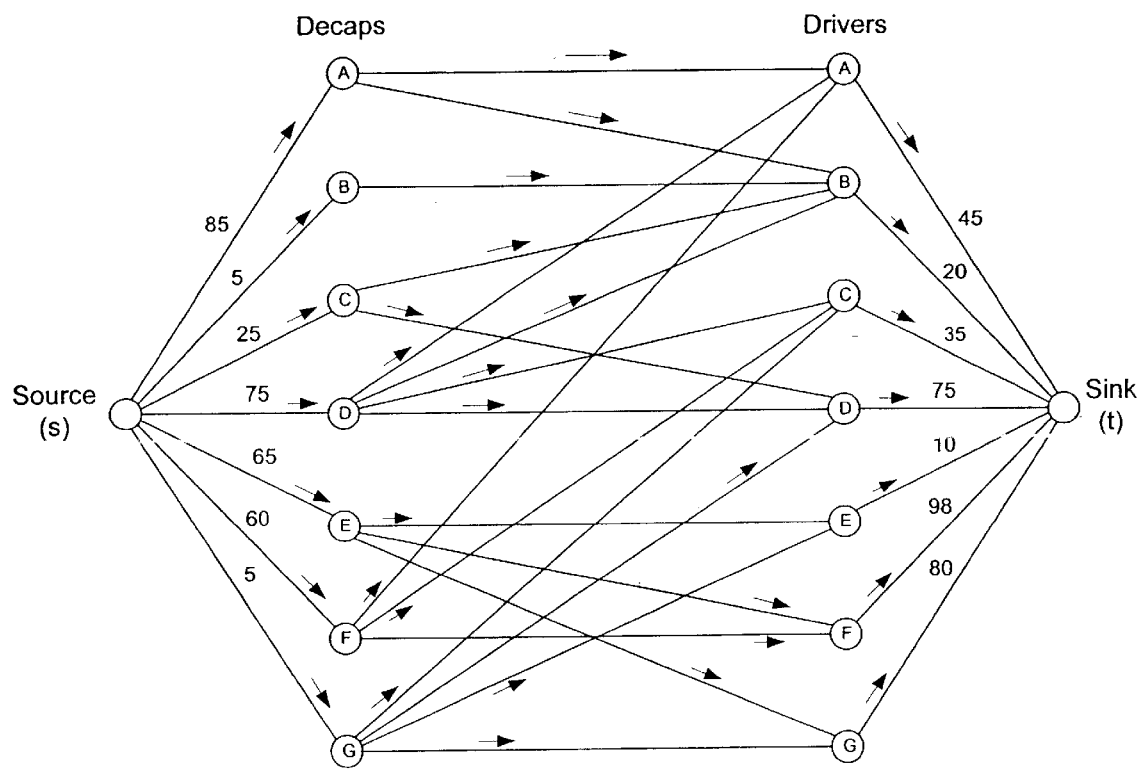

FIG. 5b shows a network that represents the decoupling capacitors and driver elements on the integrated circuit (60). Each decoupling capacitor is represented by a decoupling capacitor node that is connected to a source node. Each connection between a particular decoupling capacitor node and the source node has a value equivalent to the decoupling capacitance offer of the decoupling capacitor represented by that particular decoupling capacitor node. Such connection values serve as maximum flow constraints on the respective connections. For example, because Decap D has a decoupling capacitance offer of 75 as shown in FIG. 5a, the connection shown in FIG. 5b between the decoupling capacitor node representing Decap D and the source node also has a value of 75, and thus, a maximum flow determination of the network cannot result in a flow where the total of the maximum flow values on the connections between the decoupling capacitor node representing Decap D and connected driver element nodes exceeds a value of 75.

Each driver element is represented by a driver element node that is connected to a sink node. Each connection between a particular driver element node and the sink node has a value equivalent to the decoupling capacitance demand of the driver element represented by that particular driver element node. Such connection values serve as maximum flow constraints on the respective connections. For example, because Driver G has a decoupling capacitance demand of 80, the connection between the driver element node representing Driver G and the sink node also has a value of 80, and thus, a maximum flow determination of the network cannot result in a flow where the maximum flow values on the connections between the driver element node representing Decap D and connected decoupling capacitor nodes exceeds a value of 80.

Connections between a particular decoupling capacitor node and a particular driver element node are established if the decoupling capacitor represented by that particular decoupling capacitor node effectively provides decoupling capacitance to the driver element represented by that particular driver element node. For example, in FIG. 5b, the driver element node representing Driver A is connected to the decoupling capacitor nodes that represent Decaps A, D, and F because only Decaps A, D, and F effectively provide decoupling capacitance to Driver A, as shown by the dotted lines in FIG. 5a.

Figure 5C:
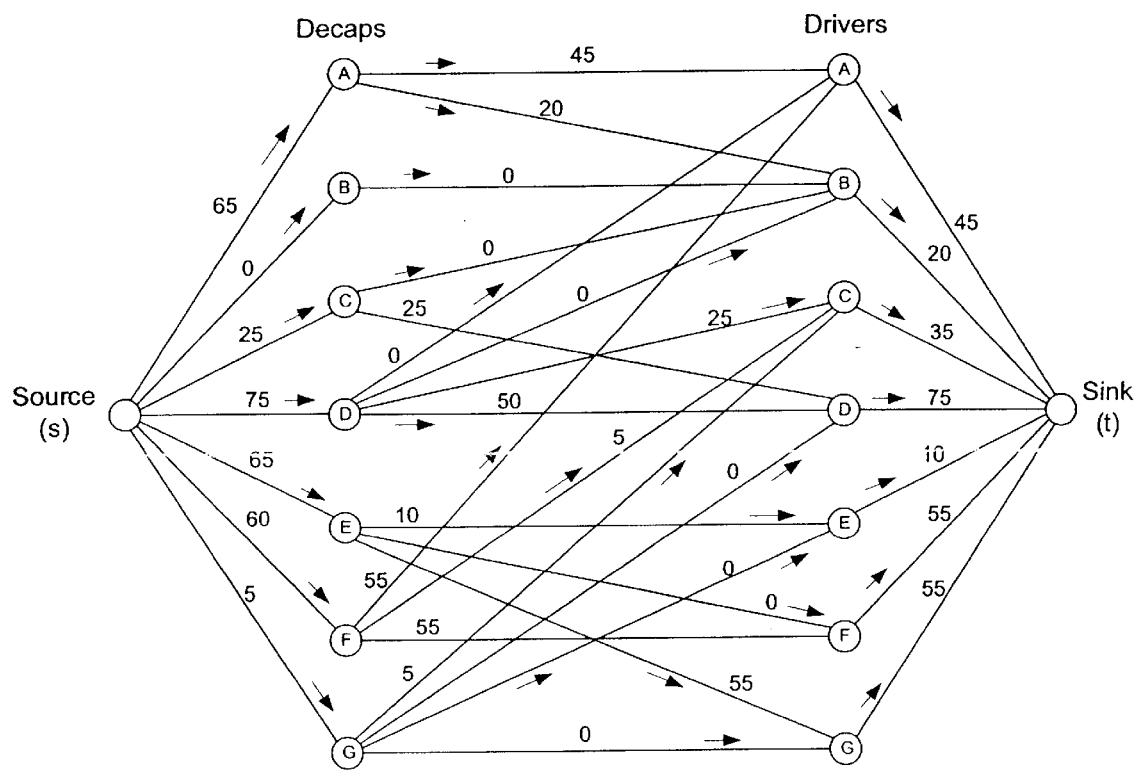

FIG. 5c shows the network shown in FIG. 5b after a maximum flow determination. As shown in FIG. 5c, connections between the decoupling capacitor and driver element nodes now have maximum flow values. A maximum flow value on a connection between a decoupling capacitor node and a driver element node represents the amount of decoupling capacitance provided by the decoupling capacitor represented by the decoupling capacitor node to the driver element represented by the driver element node. For example, in FIG. 5c, Driver F has a decoupling capacitance demand of 98 decoupling capacitance units, and 55 of that 98 is provided, i.e., "offered," to Driver F by Decap F.

Those skilled in the art will appreciate that the maximum flow values in FIG. 5c are shown for illustration purposes only. Those skilled in the art will understand that other embodiments of the present invention may use different integrated circuit structures and maximum flow determination techniques that, in turn, lead to different networks having different maximum flow values.

Figure 5D:
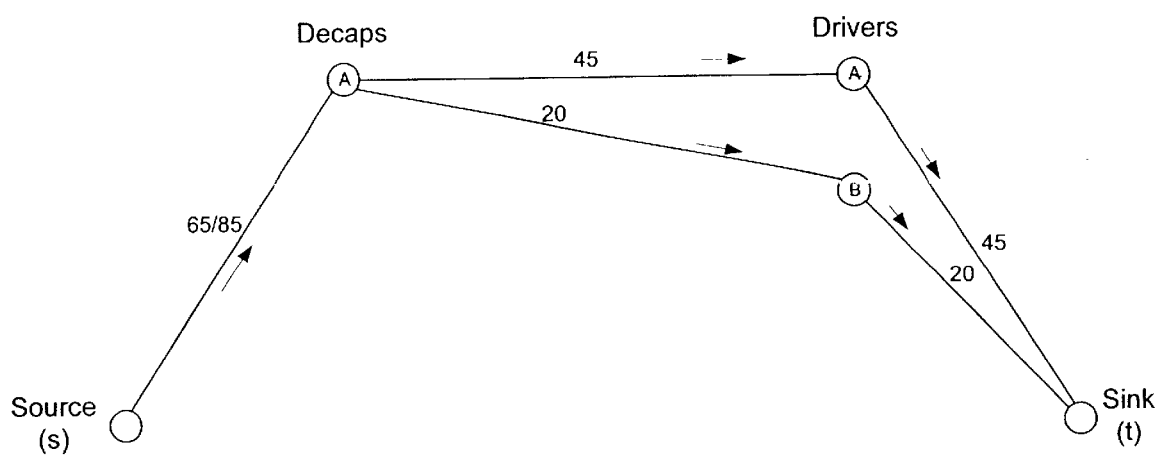

Using the network shown in FIG. 5c, one may verify whether particular decoupling capacitors are being used efficiently by examining the maximum flow values on the connections between particular nodes. For example, FIG. 5d shows an analysis of Decap A. As shown previously in FIGS. 5a–5c, Decap A can provide 85 decoupling capacitance units. The maximum flow values on the connections between Decap A and Drivers A and B indicate that Decap A provides Drivers A and B with 45 and 20 decoupling capacitance units, respectively. Thus, Decap A, in total, provides 45+20, or 65, decoupling capacitance units. Because Decap A can provide up to 85 decoupling capacitance units, only 65 of which are used, Decap A is not used efficiently. In this case, a designer may (1) use another decoupling capacitor having less decoupling capacitance, (2) add one or more driver elements to which Decap A can provide decoupling capacitance, (3) decrease the size, i.e., the strength, of Decap A, and/or (4) redesign the portion of the integrated circuit on which Decap A resides in order to generate a more efficient integrated circuit design. Those skilled in the art will appreciate that the use efficiencies of other decoupling capacitors may similarly be verified.

Figure 5E:
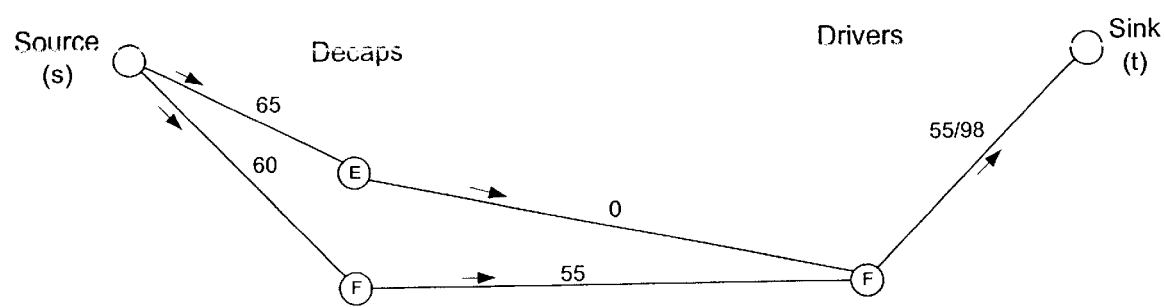

Additionally, using the network shown in FIG. 5c, one may also verify whether particular driver elements are receiving sufficient decoupling capacitance by examining the maximum flow values on the connections between particular nodes. For example, FIG. 5e shows an analysis of Driver F. As shown previously in FIGS. 5a–c, Driver F needs 98 decoupling capacitance units. The maximum flow values on the connections between Driver F and Decaps E and F indicate that Driver F receives 0 and 55 decoupling capacitance units from Decaps E and F, respectively. Thus, Driver F, in total, receives 0+55, or 55, decoupling capacitance units. Because Driver F needs 98 decoupling capacitance units and only receives 55, Driver F does not receive sufficient decoupling capacitance. In this case, a designer may (1) if possible, use another driver element having a lesser decoupling capacitance need, (2) add one or more decoupling capacitors from which Driver F can receive decoupling capacitance, (3) if possible, decrease the size, i.e., the strength, of Driver F, and/or (4) redesign the portion of the integrated circuit on which Driver F resides in order to generate an integrated circuit design in which Driver D receives more decoupling capacitance. Those skilled in the art will appreciate that the providing of decoupling capacitance to other driver elements may similarly be verified.

Figure 6:
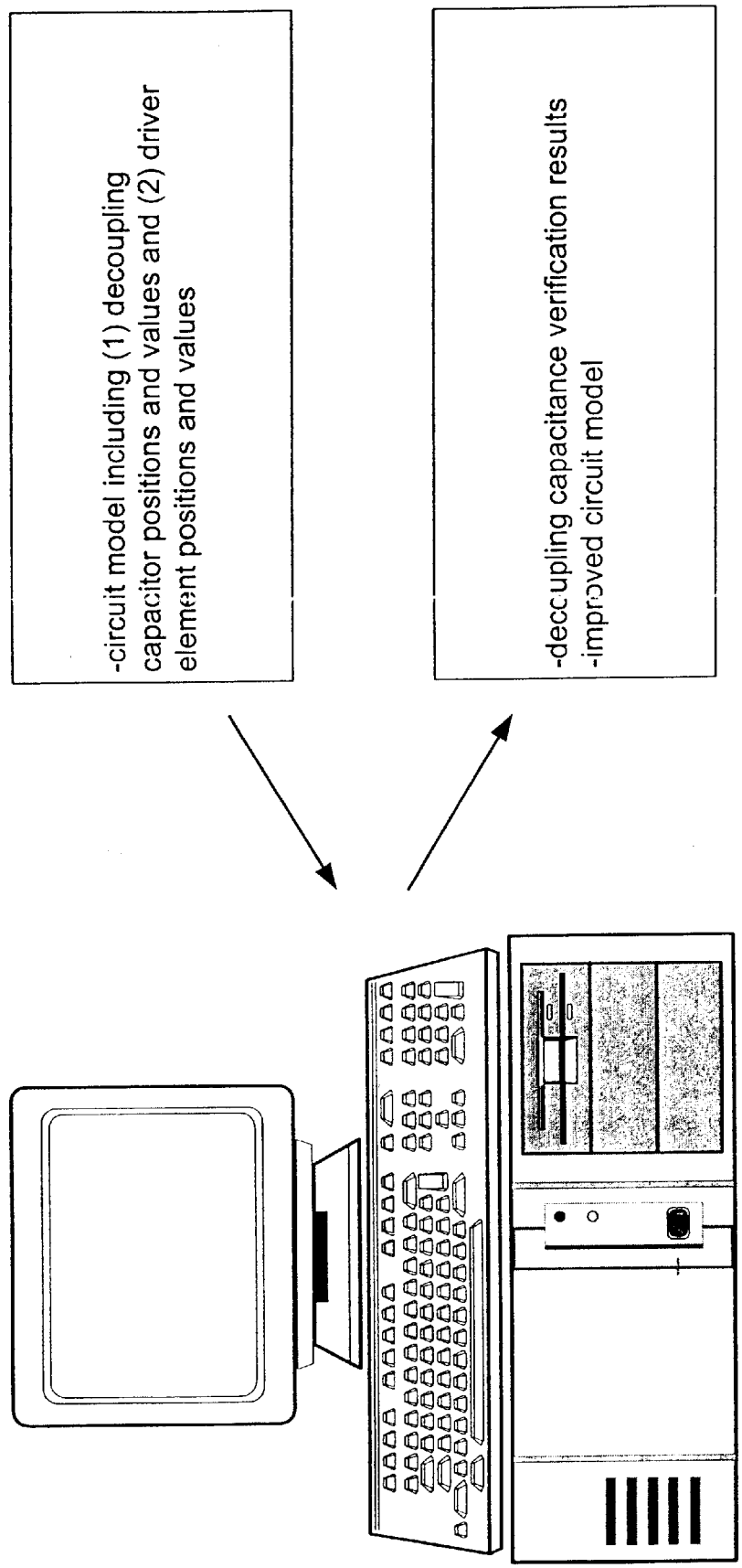
FIG. 6 shows a computer system in accordance with an embodiment of the present invention.

FIG. 6 shows an exemplary computer system (70) that verifies decoupling capacitance in accordance with an embodiment of the present invention. Input parameters (72) provided to the computer system (70) include a circuit model indicating the positions and values associated with decoupling capacitors and driver elements on a particular integrated circuit.

The input parameters (72) serve as input data to the computer system (70) via some computer-readable medium, e.g., network path, floppy disk, input file, keyboard, etc. The computer system (70) then stores the input parameters (72) in memory (not shown) to subsequently verify (via processor functions) decoupling capacitance using one of the various verification techniques discussed in the present invention. For example, the computer system (70) may determine the use efficiency of one or more decoupling capacitors using one of the previously discussed decoupling capacitor use efficiency determination techniques, or, for example, the computer system (70) may verify whether one or more driver elements are receiving sufficient decoupling capacitance using one of the previously discussed driver element decoupling capacitance verification techniques.

Thereafter, depending on a chip designer's request, the computer system (70) outputs decoupling capacitance verification results (74) via some user-readable medium, e.g., monitor display, network path, etc., where the results (74) may include information indicating which, if any, decoupling capacitors are not being used efficiently, and which, if any, driver elements are not receiving sufficient decoupling capacitance. Additionally, the results (74) may include information indicating an improved arrangement of decoupling capacitors and driver elements determined by the computer system (70).

Those skilled in the art will appreciate that in other embodiments, a software program capable of verifying decoupling capacitance using a maximum flow determination may be used. The software program, using the maximum flow determination, may also be capable of determining an improved arrangement of decoupling capacitors and driver elements.

Those skilled in the art will appreciate that embodiments of the present invention may also relate to an integrated circuit manufacturing process by which a integrated designer designs for manufacture an integrated circuit having decoupling capacitances verified by one of the decoupling capacitance verification techniques discussed in the present invention.

Advantages of the present invention may include one or more of the following. In some embodiments, because decoupling capacitance on an integrated circuit may be verified using a maximum flow determination of a network representative of decoupling capacitors and driver elements on the integrated circuit, system performance may be improved.

In some embodiments, because use efficiency of a decoupling capacitor on an integrated circuit may be verified using a maximum flow determination of a network representative of decoupling capacitors and driver elements on the integrated circuit, decoupling capacitor use on the integrated circuit may be improved.

In some embodiments, because use efficiency of a decoupling capacitor on an integrated circuit may be verified using a maximum flow determination of a network representative of decoupling capacitors and driver elements on the integrated circuit, a designer/manufacturer may determine whether another decoupling capacitor that provides less decoupling capacitance needs to be used or whether the size of the decoupling capacitor needs to be decreased, effectively allowing space on the integrated circuit to be freed up for additional functionality.

In some embodiments, because use efficiency of a decoupling capacitor on an integrated circuit may be verified using a maximum flow determination of a network representative of decoupling capacitors and driver elements on the integrated circuit, a designer/manufacturer may save power, save space, use higher strength driver elements, prevent over-designing, i.e., over compensatory design, etc.

In some embodiments, because decoupling capacitance provided to a driver element on an integrated circuit may be verified using a maximum flow determination of a network representative of decoupling capacitors and driver elements on the integrated circuit, one may determine whether the driver element is receiving sufficient decoupling capacitance.

In some embodiments, because decoupling capacitance provided to a driver element may be verified using a maximum flow determination of a network representative of decoupling capacitors and driver elements on an integrated circuit, a designer/manufacturer may determine whether another driver element that needs less decoupling capacitance needs to be used or whether the size of the driver element needs to be decreased, effectively allowing space on the integrated circuit to be freed up for additional functionality.

In some embodiments, because decoupling capacitance provided to a driver element may be verified using a maximum flow determination of a network representative of decoupling capacitors and driver elements on an integrated circuit, a designer/manufacturer may save power, save space, use higher strength driver elements, prevent over-designing, i.e., over compensatory design, etc.

In some embodiments, because decoupling capacitance on an integrated circuit may be verified using a maximum flow determination of a network representative of decoupling capacitors and driver elements on the integrated circuit, a designer may determine whether a portion or all of the integrated circuit needs to redesigned.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method for verifying decoupling capacitance on an integrated circuit, the integrated circuit having a plurality of decoupling capacitors and driver elements, the method comprising:
   defining a first node, wherein the first node represents the decoupling capacitor;
   defining a second node, wherein the second node represents the driver element;
   generating a network comprising the first node and the second node;
   selectively establishing a connection between the first node and the second node;
   determining a maximum flow value for the connection between the first node and the second node; and
   determining whether the maximum flow value is substantially equal to a decoupling capacitance need value of the driver element.

2. The method of claim 1, wherein selectively establishing a connection between the first node and the second node comprises:
   determining if the driver element receives decoupling capacitance from the decoupling capacitor; and
   if the driver element receives decoupling capacitance from the decoupling capacitor, establishing the connection between the first node and the second node.

3. The method of claim 1, wherein the driver element is a transistor.

4. A method for verifying decoupling capacitance on an integrated circuit, the integrated circuit having a plurality of decoupling capacitors and a plurality of driver elements, the method comprising, the method further comprising:
   defining a first set of nodes, wherein the first set of nodes represents the plurality of decoupling capacitors;
   defining a second set of nodes, wherein the second set of nodes represents the plurality of driver elements;
   selectively establishing a first plurality of connections between a node in the second set of nodes and nodes in the first set of nodes that represent decoupling capacitors that provide decoupling capacitance to a driver element represented by the node;
   determining maximum flow values for the first plurality of connections; and
   determining whether a total of the maximum flow values is substantially equal to a decoupling capacitance need value of the driver element.

5. The method of claim 4, the method further comprising:
   selectively establishing a second plurality of connections between a node in the first set of nodes and nodes in the second set of nodes that represent driver elements that receive decoupling capacitance from a decoupling capacitor represented by the node;
   determining maximum flow values for the second plurality of connections; and
   determining whether a total of the maximum flow values is substantially equal to a decoupling capacitance value of the decoupling capacitor.

6. A computer system, comprising:
   a processor;
   a memory; and
   instructions, residing in the processor and executable on the processor, for verifying decoupling capacitance on an integrated circuit having a plurality of driver elements and a plurality of decoupling capacitors, comprising instructions for:
   representing a decoupling capacitor on the integrated circuit with a first node;
   representing a driver element on the integrated circuit with a second node, wherein the driver element has a decoupling capacitance need value;
   generating a network comprising the first node and the second node;
   selectively establishing a connection between the first node and the second node;
   determining a maximum flow value on the connection between the first node and the second node; and
   determining whether the maximum flow value is substantially equal to the decoupling capacitance need value of the driver element.

7. The computer system of claim 6, wherein selectively establishing the connection between the first node and the second node comprises:
   determining if the driver element receives decoupling capacitance from the decoupling capacitor; and
   if the driver element receives decoupling capacitance from the decoupling capacitor, establishing a connection between the first node and the second node.

8. The computer system of claim 6, further comprising instructions for:
   defining a set of nodes, wherein the set of nodes represents the plurality decoupling capacitors on the integrated circuit;
   selectively establishing a plurality of connections between the second node and nodes in the set of nodes that represent decoupling capacitors that provide decoupling capacitance to the driver element;
   determining maximum flow values on the plurality of connections; and
   determining whether a total of the maximum flow values is substantially equal to the decoupling capacitance need value of the driver element.

9. The computer system of claim 6, further comprising instructions for:
   defining a set of nodes, wherein the set of nodes represents the plurality of driver elements on the integrated circuit;
   selectively establishing a plurality of connections between the first node and nodes in the set of nodes that represent driver elements that receive decoupling capacitance from the decoupling capacitor;
   determining maximum flow values on the plurality of connections; and
   determining whether a total of the maximum flow values is substantially equal to a decoupling capacitance value of the decoupling capacitor.

10. A method for designing an integrated circuit, comprising:
    verifying decoupling capacitance of an original design of the integrated circuit using a flow determination of a network representative of decoupling capacitors and driver elements on the integrated circuits, comprising:
      generating the network, wherein the network comprises a first set of elements representing the decoupling capacitors and a second set of elements representing the driver elements;
      selectively establishing connections between the first set of elements and the second set of elements; and
      determining a maximum flow of the network; and
    redesigning the integrated circuit dependent on the verifying.

11. The method of claim 10, wherein the flow determination is a maximum flow determination.

12. The method of claim 11, wherein selectively establishing connections between the first set of elements and second set of elements comprises:
    determining whether a decoupling capacitor represented by an element belonging to the first set of elements provides decoupling capacitance to a driver element represented by an element belonging to the second set of elements; and
    if the decoupling capacitor provides decoupling capacitance to the driver element, establishing a connection between the element representing the decoupling capacitor and the element representing the driver element.

13. The method of claim 11, wherein the maximum flow determination results in a plurality of values for the connections.

14. The method of claim 13, wherein verifying decoupling capacitance of the original design of the integrated circuit further comprises:
    selecting an element in the first set of elements; and
    determining whether a value of a decoupling capacitor represented by the element is greater than a total of the values of the connections between the element and connected elements belonging to the second set of elements.

15. The method of claim 14, wherein if the determination indicates that the value of the decoupling capacitor is greater than the total of the values of the connections between the element and connected elements belonging to the second set of elements, redesigning the integrated circuit comprises at least one selected from the group consisting of: decreasing a size of the decoupling capacitor, using another decoupling capacitor that provides less decoupling capacitance than the decoupling capacitor, adding at least one driver element to which the decoupling capacitor can provide decoupling capacitance, and redesigning a portion of the integrated circuit on which the decoupling capacitor resides.

16. The method of claim 13, wherein verifying decoupling capacitance of the original design of the integrated circuit further comprises:
    selecting an element in the second set of elements;
    determining whether a decoupling capacitance need of a driver element represented by the element is greater than a total of the values of the connections between the element and connected elements belonging to the first set of elements.

17. The method of claim 16, wherein if the determination indicates that the decoupling capacitance need of the driver element is greater than the total of the values of the connections between the element and connected elements belonging to the first set of elements, redesigning the integrated circuit comprises at least one selected from the group consisting of: using another driver element that needs less decoupling capacitance than the driver element, adding at least one decoupling capacitor from which the driver element can receive decoupling capacitance, decreasing a size of the driver element, and redesigning a portion of the integrated circuit on which the driver element resides.

18. The method of claim 10, wherein at least one of the driver elements is a transistor.

19. A computer-readable medium having recorded therein instructions executable by processing, the instructions for:
    defining a first node, wherein the first node represents a decoupling capacitor on an integrated circuit having a plurality of decoupling capacitors and driver elements;
    defining a second node, wherein the second node represents a driver element on the integrated circuit;
    generating a network comprising the first node and the second node;
    selectively establishing a connection between the first node and the second node;
    determining a maximum flow value for the connection between the first node and the second node; and
    determining whether the maximum flow value is substantially equal to a decoupling capacitance need value of the driver element.

20. The computer-readable medium of claim 19, wherein selectively establishing a connection between the first node and the second node comprises:

determining if the driver element receives decoupling capacitance from the decoupling capacitor; and if the driver element receives decoupling capacitance from the decoupling capacitor, establishing a connection between the first node and the second node.

21. A computer-readable medium having recorded therein instructions executable by processing, the instructions for:

defining a first set of nodes, wherein the first set of nodes represents a plurality of decoupling capacitors on an integrated circuit;

defining a second set of nodes, wherein the second set of nodes represents a plurality of driver elements on the integrated circuit;

selectively establishing a first plurality of connections between a node in the second set of nodes and nodes in the first set of nodes that represent decoupling capacitors that provide decoupling capacitance to a driver element represented by the node;

determining maximum flow values for the first plurality of connections; and determining whether a total of the maximum flow values is substantially equal to a decoupling capacitance need value of the driver element.

22. The computer-readable medium of claim 21, further comprising instructions for:

selectively establishing a second plurality of connections between a node in the first set of nodes and nodes in the second set of nodes that represent driver elements that receive decoupling capacitance from a decoupling capacitor represented by the node;

determining maximum flow values for the second plurality of connections; and determining whether a total of the maximum flow values is substantially equal to a decoupling capacitance value of the decoupling capacitor.

23. A method for graphically verifying decoupling capacitance on an integrated circuit having a plurality of decoupling capacitors and driver elements, comprising:

generating a directed graph comprising a plurality of decoupling capacitor nodes and a plurality of driver element nodes;

defining a source node, wherein the source node has edges connected to the plurality of decoupling capacitor nodes;

defining a sink node, wherein the sink node has edges connected to the plurality of driver element nodes;

selectively establishing a plurality of edges between the plurality of decoupling capacitor nodes and the plurality of driver element nodes;

determining a maximum flow from the source node to the sink node; and using the maximum flow to verify decoupling capacitance on the integrated circuit.

24. The method of claim 23, wherein, determining the maximum flow from the source node to the sink node comprises generating values for the plurality of edges.

25. The method of claim 23, wherein the plurality of decoupling capacitor nodes represents a plurality of decoupling capacitors on the integrated circuit, and wherein the plurality of driver element nodes represents a plurality of driver elements on the integrated circuit.

26. The method of claim 25, wherein at least one of the plurality of driver elements is a transistor.

27. The method of claim 23, wherein using the maximum flow to verify decoupling capacitance comprises:

selecting a decoupling capacitor node from the plurality of decoupling capacitor nodes;

determining if a value on the edge connecting the decoupling capacitor node to the source node is greater than a total of the values of the edges between the decoupling capacitor node and connected driver element nodes; and selectively redesigning the integrated circuit based on the determination.

28. The method of claim 23, wherein using the maximum flow to verify decoupling capacitance comprises:

selecting a driver element node from the plurality of driver element nodes;

determining if a value on the edge connecting the driver element node to the sink node is greater than a total of the values of the edges between the driver element node and connected decoupling capacitor nodes; and selectively redesigning the integrated circuit based on the determination.

* * * * *

UNITED STATES PATENT AND TRADEMARK OFFICE
CERTIFICATE OF CORRECTION

PATENT NO. : 6,694,499 B2
DATED : February 17, 2004
INVENTOR(S) : Devendra Vidhani et al.

It is certified that error appears in the above-identified patent and that said Letters Patent is hereby corrected as shown below:

<u>Column 13,</u>
Line 55, replace "claim 11" with -- claim 10 --.

<u>Column 14,</u>
Line 1, replace "claim 11" with -- claim 10 --.

Signed and Sealed this

Fifteenth Day of June, 2004

JON W. DUDAS
*Acting Director of the United States Patent and Trademark Office*